(12) United States Patent
Maeda et al.

(10) Patent No.: US 6,937,040 B2
(45) Date of Patent: Aug. 30, 2005

(54) PROBE MODULE AND A TESTING APPARATUS

(75) Inventors: Yasuhiro Maeda, Tokyo (JP); Fumikazu Takayanagi, Tokyo (JP)

(73) Assignee: Advantest Corporation (JP)

( * ) Notice: Subject to any disclaimer, the term of this patent is extended or adjusted under 35 U.S.C. 154(b) by 0 days.

(21) Appl. No.: 10/776,033

(22) Filed: Feb. 10, 2004

(65) Prior Publication Data

US 2004/0212379 A1 Oct. 28, 2004

Related U.S. Application Data

(63) Continuation of application No. PCT/JP02/07410, filed on Jul. 23, 2002.

(30) Foreign Application Priority Data

Aug. 10, 2001 (JP) ........................................ 2001-244161

(51) Int. Cl.[7] .............................................. G01R 31/02
(52) U.S. Cl. ........................................ 324/754; 324/755
(58) Field of Search ................................ 324/754, 755, 324/757, 758, 761, 762, 765

(56) References Cited

U.S. PATENT DOCUMENTS 5,442,300 A * 8/1995 Nees et al. ................... 324/762
5,751,151 A * 5/1998 Levy et al. ................... 324/537
6,819,132 B2 * 11/2004 Byrd .............................. 324/765

FOREIGN PATENT DOCUMENTS

| JP | 8-75758 | 3/1996 | ........... G01N/37/00 |
| JP | 10-197559 | 7/1998 | ........... G01R/1/073 |

OTHER PUBLICATIONS

Patent Abstracts of Japan, Publication No. 10–197559, Publication Date Jul. 31, 1998, 1 page.
Patent Abstracts of Japan, Publication No. 08–075758, Publication Date Mar. 22, 1996, 1 page.
Japanese International Preliminary Examination Report dated Apr. 14, 2003, 3 pages.
International Search Report dated Nov. 5, 2002, 2 pages.

* cited by examiner

*Primary Examiner*—Vinh Nguyen
*Assistant Examiner*—Russell M. Kobert
(74) *Attorney, Agent, or Firm*—Osha Liang LLP

(57) ABSTRACT

A probe module electrically coupled to a terminal of a device under test for sending and/or receiving a signal to and/or from the device under test, includes a first substrate, a probe pin provided on the first substrate to be in contact with the terminal of the device under test, a first signal transmission pattern formed on the first substrate, the first signal transmission pattern being electrically coupled to the probe pin, with a gap formed at the first signal transmission pattern not to transmit any electric signal, and a for short-circuiting or open-circuiting the gap of the first signal transmission pattern.

12 Claims, 5 Drawing Sheets

PROBE MODULE AND A TESTING APPARATUS

The present application is a continuation application of PCT/JP02/07410 filed on Jul. 23, 2002 which claims the benefit of, and priority from, a Japanese patent application No. 2001-244161 filed on Aug. 10, 2001, the entire contents of which are incorporated herein by reference for all purposes.

BACKGROUND OF THE INVENTION

1. Field of the Invention

The present invention relates to a probe module and a testing apparatus.

2. Related Art

FIGS. 5A and 5B show the configuration of an interface part 200 of a conventional semiconductor testing apparatus for a device under test. The interface part 200 sends and receives electric signals with an IC chip, which is a device under test formed on a wafer 202, at a test head of the semiconductor testing apparatus. FIG. 5A shows a cross-sectional view of the interface part 200 and FIG. 5B shows a circuit of the interface part 200.

As shown in FIG. 5A, the interface part 200 includes a probe needle 204, a probe card 206, a connector 208, a performance board 210, and a relay 212. The probe needle 204 is a tungsten (W) needle in a cantilever shape supported at the probe card 206, being in contact with a pad of the IC chip on the wafer 202. The probe card 206 arranges the probe needles 204 in a circular shape, having a plurality of layers to couple the probe needles 204 and the connectors 208 using a wiring pattern. The connectors 208 are arranged in a circular shape to couple the probe card 206 and the performance board 210 electrically in order that they can be detachable. The performance board 210 is mounted on the test head of the semiconductor testing apparatus, having a plurality of layers coupled with the electronic circuit of the test head electrically. The relay 212 is a switch means which is turned on or off based on a control signal to supply the test signal to the IC chip formed on the wafer 202.

The interface part 200 allows the probe needle 204 to be in contact with the pad of the IC chip on the wafer 202 and supplies the test signal from the semiconductor testing apparatus to the IC chip or supplies the output signal from the IC chip to the semiconductor testing apparatus, so that the semiconductor testing apparatus can test the IC chip.

As shown in FIG. 5B, the test signal supplied to the IC chip from the semiconductor testing apparatus is coupled to a test pin of the IC chip one to one via the relay 212, which is one of the switch means S1, S2 . . . , and the probe needle 204 from one of pins of the semiconductor testing apparatus P1, P2 . . . .

In the configuration of the conventional interface part 200, however, there is a practical problem that it cannot correspond to the test signal of high frequency accompanying the semiconductor testing apparatus of high speed because of the length of the wiring between the probe needle 204 and the semiconductor testing apparatus.

SUMMARY OF THE INVENTION

Accordingly, it is an object of the present invention to provide a probe module and a testing apparatus, which is capable of overcoming the above drawbacks accompanying the conventional art. The above and other objects can be achieved by combinations described in the independent claims. The dependent claims define further advantageous and exemplary combinations of the present invention.

In order to solve the problems above, according to the first aspect of the present invention, a probe module electrically coupled to a terminal of a device under test for sending and/or receiving a signal to and/or from the device under test, includes a first substrate, a probe pin provided on the first substrate to be in contact with the terminal of the device under test, a first signal transmission pattern formed on the first substrate, the first signal transmission pattern being electrically coupled to the probe pin, with a gap formed at the first signal transmission pattern not to transmit any electric signal and a first switch means for short-circuiting or open-circuiting the gap of the first signal transmission pattern.

The probe module may further include a second signal transmission pattern formed on the first substrate, the second signal transmission pattern being electrically coupled to the probe pin, with a gap formed at the second signal transmission pattern not to transmit any electric signal, and a second switch means for short-circuiting or open-circuiting the gap of the second signal transmission pattern, wherein the probe pin may be coupled to a joining point of the first and second signal transmission patterns.

The first signal transmission pattern may supply a pulse input signal to the device under test, the second signal transmission pattern may supply a direct current input signal to the device under test, and the first and second switch means may control whether to supply the pulse input signal or direct current input signal to the device under test.

The gap may be arranged near the probe pin on the first substrate.

The first switch means may be a switch actuator, of which a first end is fixed and a second end includes a contact to short-circuit the gap.

The probe module may further include a second substrate provided substantially parallel to the first substrate, wherein the first end of the switch actuator may be fixed to the second substrate and the second end of the switch actuator is arranged near the gap.

The switch actuator may include a bimorph element formed by laminating two materials of which thermal expansion coefficients are different from each other and a heater for heating the bimorph element, wherein the bimorph element may move the contact to short-circuit the gap, the bimorph element being heated by the heater.

The bimorph element may include an aluminum layer and a silicon oxide layer.

The switch actuator may be a piezoelectric bimorph actuator.

The first signal transmission pattern may be a strip line.

The first signal transmission pattern may be a coplanar line.

The first substrate may be arranged substantially perpendicular to the device under test.

According to the second aspect of the present invention, a testing apparatus for testing a device under test, includes a pattern generating unit for generating a test signal to test the device under test, a probe module for receiving the test signal generated by the pattern generating unit, supplying the received test signal to the device under test, and receiving an output signal outputted by the device under test based on the test signal and a judging unit for judging quality of the device under test based on the output signal received by the probe module, wherein the probe module includes a first substrate, a probe pin provided on the first substrate to be in contact with the terminal of the device under test, a first signal transmission pattern formed on the first substrate, the first signal transmission pattern being electrically coupled to the probe pin, with a gap formed at the first signal transmission pattern not to transmit any electric signal, and a switch means for short-circuiting or open-circuiting the gap of the first signal transmission pattern.

The summary of the invention does not necessarily describe all necessary features of the present invention. The present invention may also be a sub-combination of the features described above.

BRIEF DESCRIPTION OF THE DRAWINGS

FIG. 2A is a perspective view of each part of a probe module, and FIG. 2B is a cross-sectional view of each part of the probe module.

FIG. 3A is a perspective view of a probe module, FIG. 3B is a cross-sectional view of a probe module switched off, and FIG. 3C is a cross-sectional view of a probe module switched on.

FIG. 4A shows switch actuators being switched for input and output signals to a device under test, and FIG. 4B shows switch actuators being switched for a pulse input signal and a direct current input signal supplied to a de vice under test.

FIG. 5A shows a cross-sectional view of an interface part, and FIG. 5B shows a circuit of an interface part.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
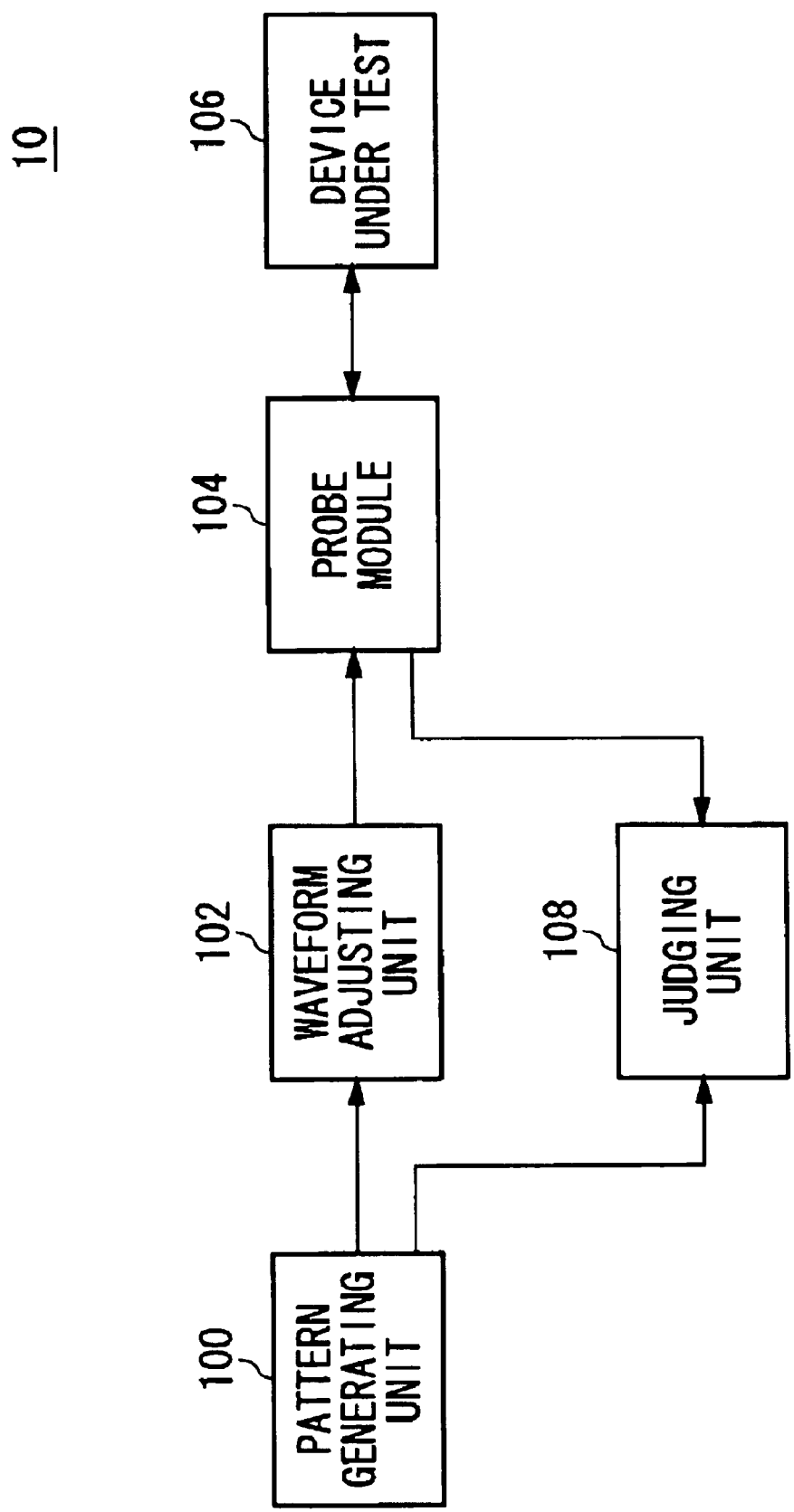
FIG. 1 shows an example of the configuration of a semiconductor testing apparatus.

FIG. 1 shows an example of the configuration of a semiconductor testing apparatus 10 according to the present invention. The semiconductor testing apparatus 10 includes a pattern generating unit 100, a waveform adjusting unit 102, a probe card 50, and a judging unit 108.

The pattern generating unit 100 generates a test signal to test a device under test 106, and supplies it to the waveform adjusting unit 102.

The waveform adjusting unit 102 adjusts the test signal generated by the pattern generating unit 100, and supplies the adjusted test signal to the probe module 104. The waveform adjusting unit 102 may supply the test signal to the probe module 104 at a desired timing. In this case, the waveform adjusting unit 102 may include a timing generator to generate the desired timing. The timing generator may include a changeable delay circuit to receive a reference clock for controlling the semiconductor testing apparatus 10 and delay the received reference clock as much as the desired time using the changeable delay circuit, so that it can supply the delayed reference clock to the waveform adjusting unit 102 as the desired timing.

The probe module 104 is electrically coupled to a plurality of terminals provided to the device under test 106, and supplies the test signal to the device under test 106. In addition, the probe module 104 receives the output signal outputted by the device under test 106 based on the test signal, and supplies the received output signal to judging unit 108.

The judging unit 108 judges the quality of the device under test 106 based on the output signal outputted by the device under test 106 based on the test signal. The judging unit 108 may judge the quality of the device under test 106 by comparing an expected signal supposed to be outputted by the device under test based on the test signal with the output signal outputted by the device under test 106. In this case, the pattern generating unit 100 may generate the expected signal based on the generated test signal and supply it to the judging unit 108.

Figure 2A:
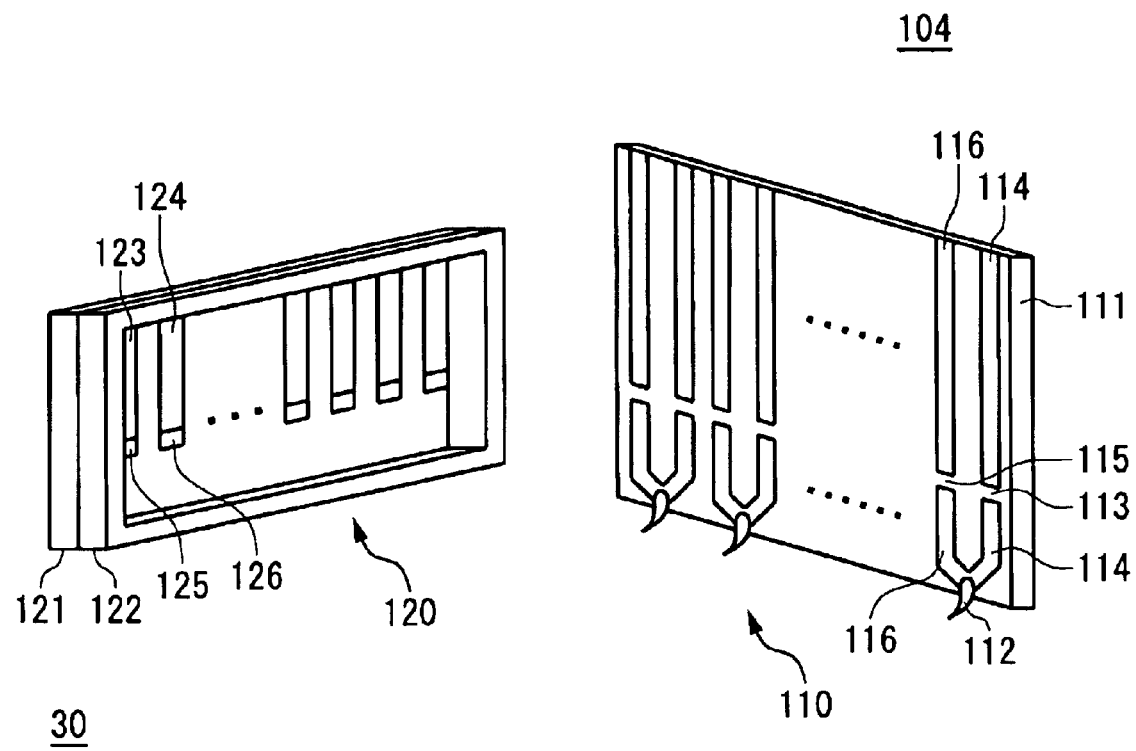
FIGS. 2A and 2B show an example of the configuration of a probe module. Specifically.
Figure 2B:
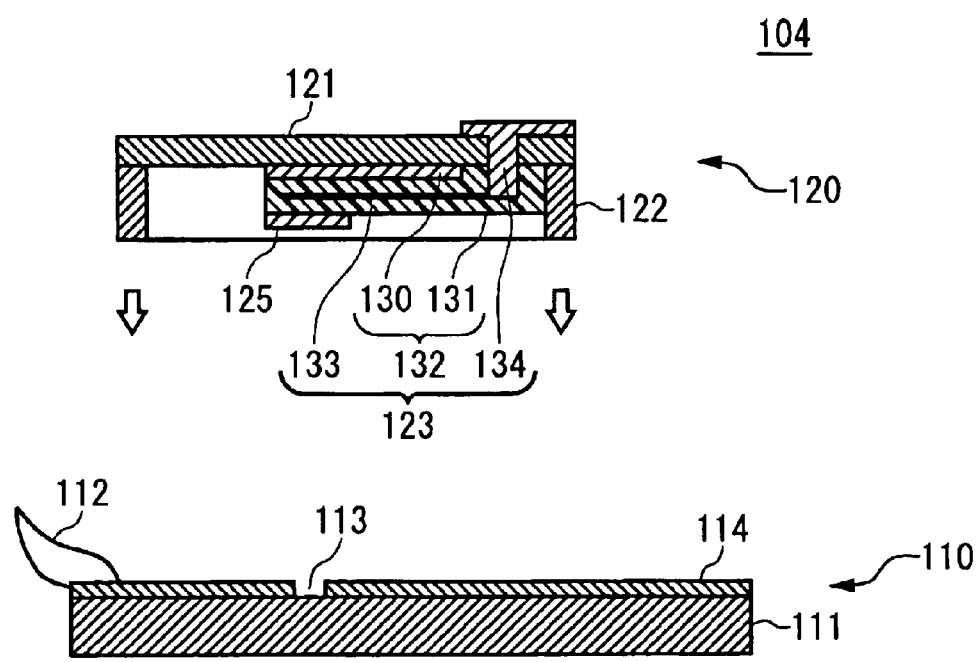
Figure 3A:
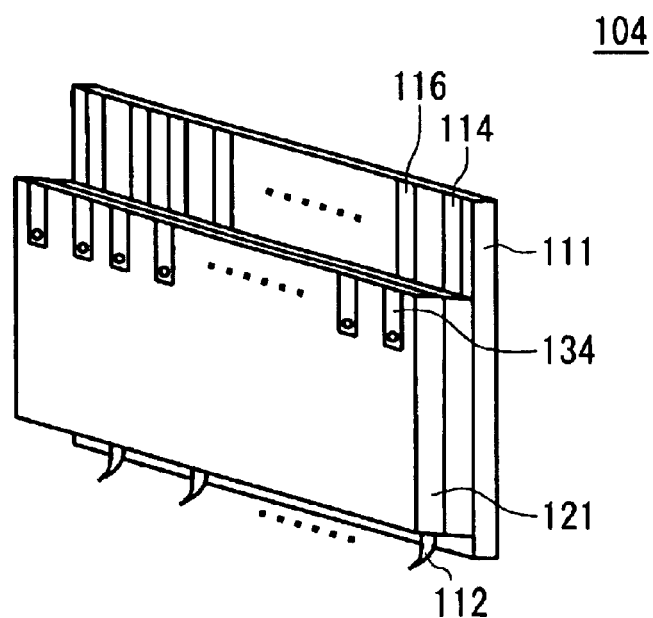
FIGS. 3A to 3C show an example of the configuration of a probe module. Specifically.
Figure 3B:
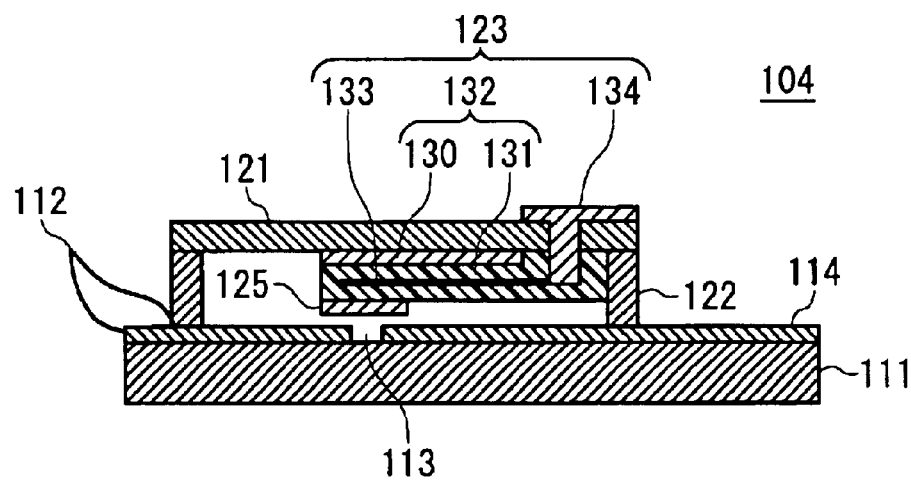
Figure 3C:
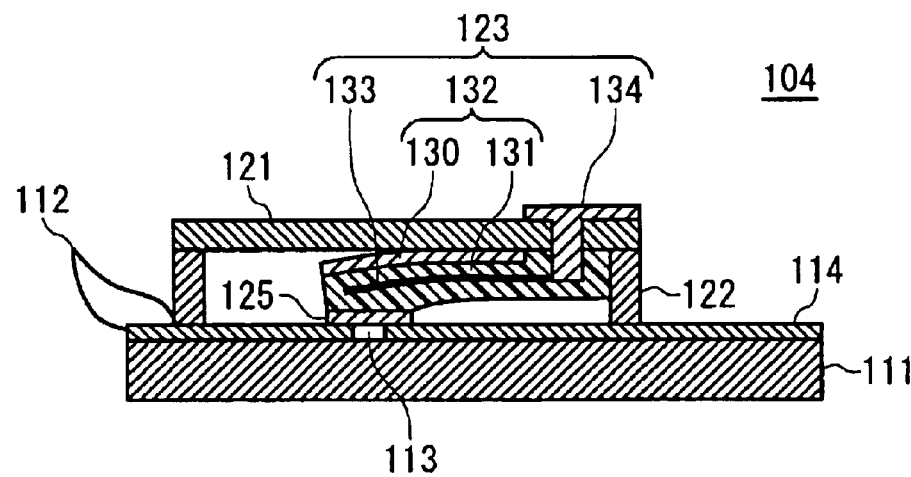

FIGS. 2 and 3 show an example of the configuration of the probe module 104. FIG. 2A is a perspective view of each part of the probe module 104, and FIG. 2B is a cross-sectional view of each part of the probe module 104. FIG. 3A is a perspective view of the probe module 104, FIG. 3B is a cross-sectional view of the probe module 104 switched off, and FIG. 3C is a cross-sectional view of the probe module 104 switched on.

The probe module 104 includes two base parts 110 and 120, which are designed to be unified to form the probe module 104.

As shown in FIG. 2A, the base part 110 includes a substrate 111, a plurality of probe pins 112 provided on the substrate 111 to be in contact with the terminals of the device under test 106, a plurality of signal transmission patterns 114 formed on the substrate 111, including a pattern gap 113 not to transmit any electric signal and being coupled to the plurality of probe pins 112 electrically, and a plurality of signal transmission patterns 116 formed on the substrate 111, including a pattern gap 115 not to transmit any electric signal and being coupled to the plurality of probe pins 112 electrically.

The substrate 111 has preferably good characteristics in high frequency such as ceramic. The pattern gaps 113 and 115 are formed by etching a metal layer evaporated on the substrate 111.

One ends of the signal transmission patterns 114 and 116 are connector terminals coupled to the test head of the semiconductor testing apparatus 10. In addition, the signal transmission patterns 114 and 116 are joined each other on the substrate 111, and the probe pins 112 are coupled to the joining point of the signal transmission patterns 114 and 116. The probe pins 112 are joined by heating alloys of elasticity such as beryllium-copper, palladium-copper-silicon, or the like using an ultrasonic wave on the joining point of the signal transmission patterns 114 and 116.

The pattern gaps 113 and 115 are preferably arranged near the probe pins 112 on the substrate 111. Since the wirings from the probe pins 112 to the pattern gaps 113 or 115 are short in length, the interference between the signals transmitted between the semiconductor testing apparatus 10 and the device under test 106 via the signal transmission patterns 114 and the signals transmitted between the semiconductor testing apparatus 10 and the device under test 106 via the signal transmission patterns 116 can be reduced.

The signal transmission patterns 114 and 116 may be strip lines or coplanar lines. In other words, they are formed to have predetermined characteristic impedance with a clad surface being provided on an inner or outer surface of the substrate 111. The clad surface is arranged near the signal transmission patterns 114 and 116, and the impedance is matched. Accordingly, the probe module 104 whose frequency characteristics are good can be provided without deteriorating the waveform of the electric signal transmitted between the semiconductor testing apparatus 10 and the device under test 106.

As shown in FIG. 2A, the base part 120 includes a substrate 121 provided substantially parallel to the substrate 111, a base side part 122 for holding the substrates 111 and 121 being separated from each other, switch actuators 123 for short-circuiting or open-circuiting the pattern gaps 113 of the signal transmission patterns 114, and switch actuators 124 for short-circuiting or open-circuiting the pattern gaps 115 of the signal transmission patterns 116. The switch actuators 123 and 124 are an example of the switch means of the present invention. The switch actuators 123 and 124 have the same configuration, and hereinafter the switch actuators 123 will be described as a representative example.

The substrate 121 has preferably good characteristics in high frequency such as ceramic.

One ends of the switch actuators 123 are fixed to the substrate 121, the other ends are arranged near the pattern gaps 113, and contacts 125 are provided at the other ends to short-circuit the pattern gaps 113. The contacts 125 are formed of gold by plating, evaporating, sputtering, or the like.

The switch actuator 123, e.g. a MEMS (Micro Electro Mechanical System) switch, includes a bimorph element 132 formed by laminating two materials 130 and 131 whose thermal expansion coefficients are different from each other, a heater 133 for heating the bimorph element 132, and a heater terminal 134 for supplying power to the heater 133. The heater 133 is supplied with power to heat the bimorph element 132, so that the bimorph element can move the contact 125 and then the switch actuator 123 short-circuits the pattern gap 113.

The bimorph element 132 includes, e.g. an aluminum layer 130 and a silicon oxide layer 131. The silicon oxide layer 131 is formed on the top of the aluminum layer 131 by sputtering. In addition, the heater 133 is formed of platinum by photographing the surface of the silicon oxide layer 131, and is coupled to the heater terminal 134.

In another example, the switch actuator 123 may have a piezoelectric bimorph element formed by laminating piezoelectric ceramic and deformed by the piezoelectric effect when certain voltage is applied. The switch actuator 123 may be an electrostatic switch for moving the contact by an electrostatic attractive force.

As shown in FIG. 2B, the base parts 110 and 120 adhere to and are unified each other in order that the contacts 125 and the pattern gaps 113 can face each other. The base side part 122 forms gaps between the contacts 125 and the pattern gaps 113 when the base parts 110 and 120 are unified.

In addition, as shown in FIG. 3A, the probe module 104 is disposed at the test head of the semiconductor testing apparatus 10 in order that the substrates 111 and 121 can be arranged substantially perpendicular to the device under test.

In addition, as shown in FIG. 3B, when the heater 133 is not supplied with power from the heater terminal 134, the pattern gap 113 comes into a switched-on state in which the pattern gap 113 is open.

Meanwhile, as shown in FIG. 3C, when the heater 133 is supplied with power from the heater terminal 134, the bimorph element 132 is bent by the difference between the coefficients of the aluminum layer 130 and the silicon oxide layer 131, and then the contact 125 comes into the switched-on state in which the pattern gap 113 is short-circuited.

According to the probe module 104 of the present embodiment, due to the use of the MEMS switch, the capacitance of the contacts 125 and 126 can be small, the wirings between the semiconductor testing apparatus 10 and the device under test 106 can be short in length, and the clad surface can be arranged near the switch actuators 123, so that the signals of high frequency between the semiconductor testing apparatus 10 and the device under test 106 can be transmitted highly accurately. In addition, since the on/off control of the electric signals transmitted between the semiconductor testing apparatus 10 and the device under test 106 is controlled by using the MEMS switch which can be easily miniaturized, it is possible to provide the probe module 104 whose density can be easily increased corresponding to the device under test 106 whose pad arrangement is minute in pitch.

Figure 4A:
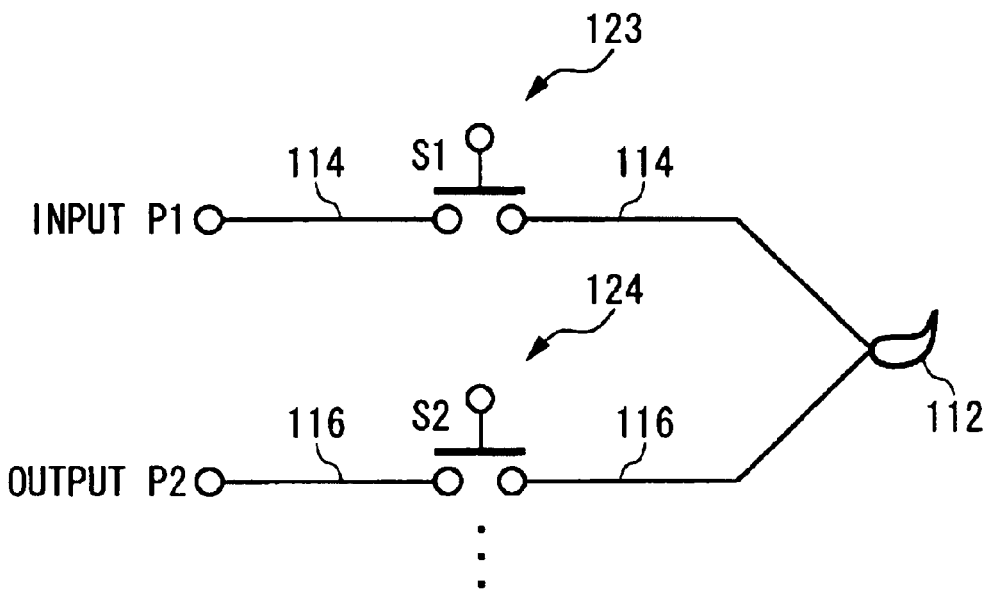
FIGS. 4A and 4B show a circuit of a probe module. Specifically.
Figure 4B:
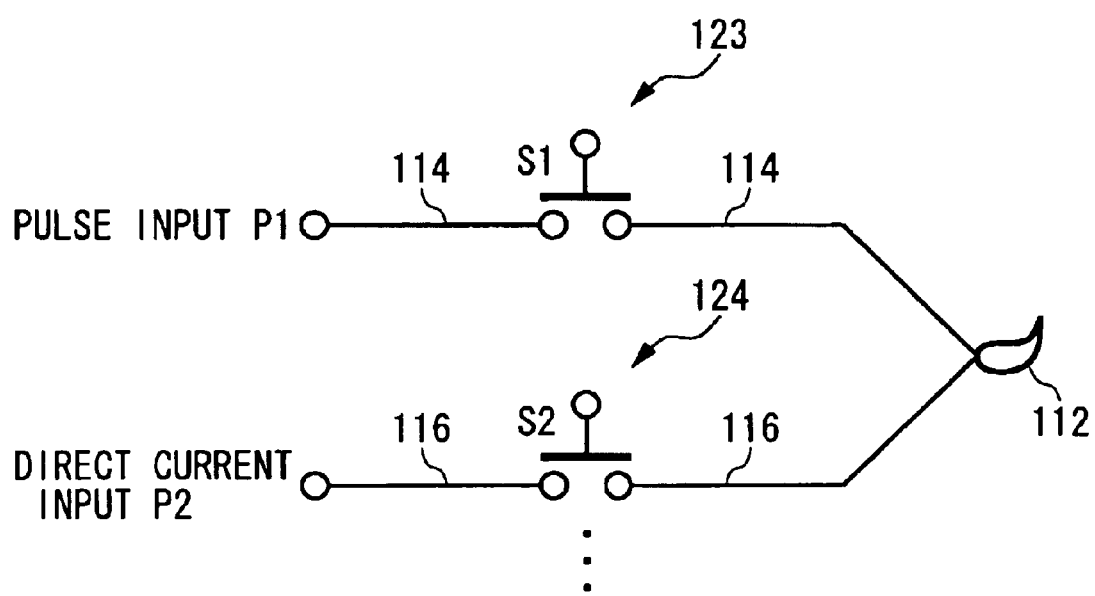
Figure 5A:
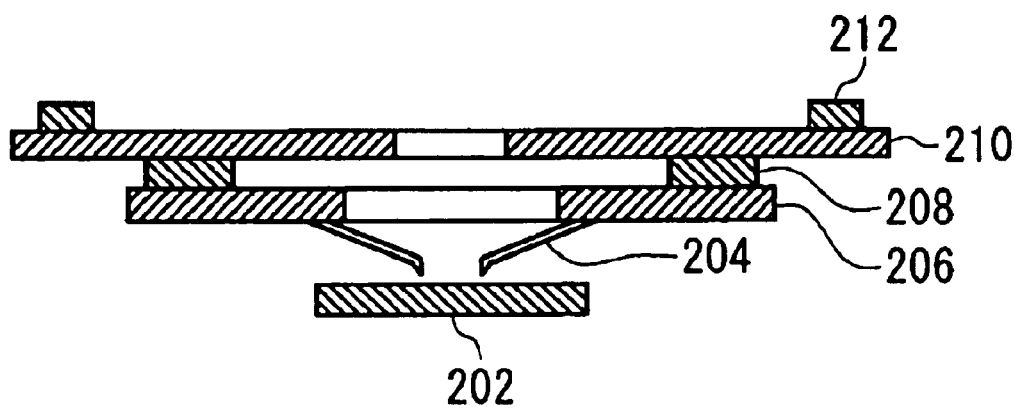
FIGS. 5A and 5B show the configuration of an interface part of a conventional semiconductor testing apparatus for a device under test. Specifically.
Figure 5B:
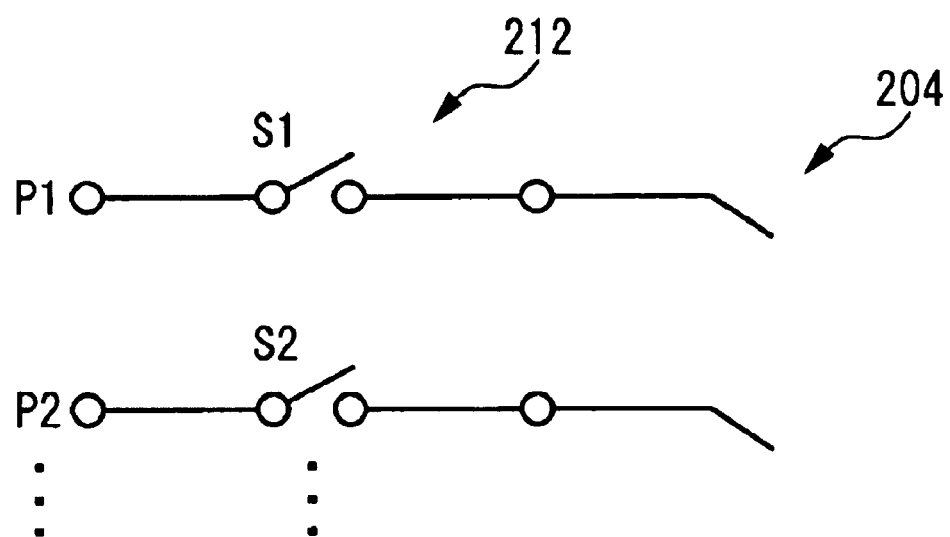

FIGS. 4A and 4B show a circuit of the probe module 104. FIG. 4A shows the switch actuators 123 and 124 being switched for the input and output signals to the device under test 106, and FIG. 4B shows the switch actuators 123 and 124 being switched for the pulse input signal and the direct current input signal supplied to the device under test 106.

As shown in FIG. 4A, the probe module 104 may take the signal transmission line 114 as the input signal line and the signal transmission line 116 as the output signal line. The switch actuator 123, which is the switch means S1, is switched on or off to transmit the input signal from the pin P1 of the semiconductor testing apparatus 10 towards the device under test 106, and the switch actuator 124, which is the switch means S2, is switched on or off to transmit the output signal from the device under test 106 towards the pin P2 of the semiconductor testing apparatus 10. By switching on the switch means S1, the signal transmission line 114 supplies the input signal from the probe pin 112 to the device under test 106. By switching off the switch means S2, the signal transmission line 116 supplies the output signal from the probe pin 112 to the semiconductor testing apparatus 10.

Since the probe module 104 controls each on/off operation with the input and output signal transmission lines being divided separately so that the interference between the input and output signals can be prevented, it can be easily achieved that the semiconductor testing apparatus 10 performs the test with high speed.

As shown in FIG. 4B, the probe module 104 may take the signal transmission line 114 as the pulse (AC) input signal line and the signal transmission line 116 as the direct current (DC) input signal line. The switch actuator 123, which is the switch means S1, is switched on or off to transmit the pulse input signal from the pin P1 of the semiconductor testing apparatus 10 towards the device under test 106, and the switch actuator 124, which is the switch means S2, is switched on or off to transmit the direct current input signal from the pin P2 of the semiconductor testing apparatus 10 towards the device under test 106. By switching on the switch means S1, the signal transmission line 114 supplies the pulse input signal from the probe pin 112 to the device under test 106. By switching off the switch means S2, the signal transmission line 116 supplies the direct current input signal from the probe pin 112 to the device under test 106. In other words, the switch means S1 and S2 control whether to supply the pulse input signal or the direct current input signal to the device under test 106.

Since the probe module 104 controls each on/off operation with the pulse input signal and direct current input signal lines being divided separately so that the interference between the pulse input signal and direct current input signal can be prevented, it can be easily achieved that the semiconductor testing apparatus 10 performs the test with high speed.

Although the present invention has been described by way of exemplary embodiments, it should be understood that those skilled in the art might make many changes and substitutions without departing from the spirit and the scope of the present invention, which is defined only by the appended claims.

Industrial Applicability

As is obvious from the description above, according to the present invention, it is possible to provide a probe module whose high frequency characteristics are good, capable of highly accurately transmitting the high frequency signal between a semiconductor testing apparatus and a device under test.

What is claimed is:

1. A probe module electrically coupled to a terminal of a device under test for sending and/or receiving a signal to and/or from said device under test, comprising:
   a first substrate; a probe pin provided on said first substrate to be in contact with said terminal of said device under test;
   a first signal transmission pattern formed on said first substrate, said first signal transmission pattern being electrically coupled to said probe pin, with a gap formed at said first signal transmission pattern not to transmit any electric signal;
   a first switch means for short-circuiting or open-circuiting said gap of said first signal transmission pattern;
   a second signal transmission pattern formed on said first substrate, said second signal transmission pattern being electrically coupled to said probe pin, with a gap formed at said second signal transmission pattern not to transmit any electric signal; and
   a second switch means for short-circuiting or open-circuiting said gap of said second signal transmission pattern,
   wherein said probe pin is coupled to a joining point of said first and second signal transmission patterns, and
   wherein the first switch means and the second switch means are controlled such that a first signal on the first transmission pattern does not interfere with a second signal on the second transmission pattern.

2. A probe module as claimed in claim 1, wherein said first signal transmission pattern supplies a pulse input signal to said device under test, said second signal transmission pattern supplies a direct current input signal to said device under test, and said first and second switch means control whether to supply said pulse input signal or direct current input signal to said device under test.

3. A probe module as claimed in claim 1, wherein said gap is arranged near said probe pin on said first substrate.

4. A probe module as claimed in claim 1, wherein said first switch means is a switch actuator, of which a first end is fixed and a second end comprises a contact to short-circuit said gap.

5. A probe module as claimed in claim 4 further comprising:
   a second substrate provided substantially parallel to said first substrate, wherein said first end of said switch actuator is fixed to said second substrate and said second end of said switch actuator is arranged near said gap.

6. A probe module as claimed in claim 4, wherein said switch actuator comprises:
   a bimorph element formed by laminating two materials of which thermal expansion coefficients are different from each other; and
   a heater for heating said bimorph element, wherein said bimorph element moves said contact to short-circuit said gap, said bimorph element being heated by said heater.

7. A probe module as claimed in claim 6, wherein said bimorph element comprises an aluminum layer and a silicon oxide layer.

8. A probe module as claimed in claim 4, wherein said switch actuator is a piezoelectric bimorph actuator.

9. A probe module as claimed in claim 1, wherein said first signal transmission pattern is a strip line.

10. A probe module as claimed in claim 1, wherein said first signal transmission pattern is a coplanar line.

11. A probe module as claimed in claim 1, wherein said first substrate is arranged substantially perpendicular to said device under test.

12. A testing apparatus for testing a device under test, comprising:
   a pattern generating unit for generating a test signal to test said device under test;
   a probe module for receiving said test signal generated by said pattern generating unit, supplying said received test signal to said device under test, and receiving an output signal outputted by said device under test based on said test signal;
   a judging unit for judging quality of said device under test based on said output signal received by said probe module,
   wherein said probe module comprises:
      a first substrate;
      a probe pin provided on said first substrate to be in contact with said terminal of said device under test;
      a first signal transmission pattern formed on said first substrate, said first signal transmission pattern being electrically coupled to said probe pin, with a gap formed at said first signal transmission pattern not to transmit any electric signal; and
      a switch means for short-circuiting or open-circuiting said gap of said first signal transmission pattern;
      a second signal transmission pattern formed on said first substrate, said second signal transmission pattern being electrically coupled to said probe pin, with a gap formed at said second signal transmission pattern not to transmit any electric signal; and
      a second switch means for short-circuiting or open-circuiting said gap of said second signal transmission pattern,
      wherein said probe pin is coupled to a joining point of said first and second signal transmission patterns, and
      wherein the first switch means and the second switch means are controlled such that a first signal on the first transmission pattern does not interfere with a second signal on the second transmission pattern.

* * * * *